LIGHT SENSITIVE STORAGE DEVICE INCLUDING DIODE ARRAY

Filed May 25, 1967

INVENTORS M. H. CROWELL
J. V. DALTON
E. I. GORDON
E. F. LABUDA
BY Wilford L. Wisner
ATTORNEY Dec. 31, 1968 M. H. CROWELL ET AL 3,419,746
LIGHT SENSITIVE STORAGE DEVICE INCLUDING DIODE ARRAY
Filed May 25, 1967 Sheet 2 of 2

3,419,746
LIGHT SENSITIVE STORAGE DEVICE INCLUDING DIODE ARRAY

Merton H. Crowell, Morristown, John V. Dalton, Oldwick, Eugene I. Gordon, Convent Station, and Edward F. Labuda, Madison, N.J., assignors to Bell Telephone Laboratories, Incorporated, Berkeley Heights, N.J., a corporation of New York Filed May 25, 1967, Ser. No. 641,257
7 Claims. (Cl. 315—10)

ABSTRACT OF THE DISCLOSURE

Television camera tubes having semiconductor diode array target structures scanned by an electron beam are provided with a semi-insulating layer contacting the separate diode regions and extending over an insulating layer between the diodes. The semi-insulating layer provides a time constant that is effective to prevent excessive charge buildup on the insulating layer from the electron beam while not substantially impairing the camera resolution, or equivalently the charge difference between neighboring diode junctions during the period of one frame. The semi-insulating layer can be a deposited material such as silicon monoxide, antimony trisulfide or cadmium sulfide or can be a silicon monoxide layer formed by heating at an interface between the insulating layer of silicon dioxide and an overlying layer of silicon, the silicon subsequently being at least partially etched away to isolate the diodes except for conduction through the semi-insulating layer. The diode junctions can be formed by diffusion through the overlying layer of silicon into the silicon substrate, in order to prevent formation of pinholes in the silicon dioxide insulating layer.

*Background of the invention*

This invention relates to light sensitive storage devices, and more particularly, to television camera tubes having semiconductor target structures.

The patent of Reynolds, 3,011,089, issued Nov. 28, 1961, describes a light sensitive storage device that can be used as a television camera tube. Its target structure is a planar n-type semiconductor substrate maintained at a fixed potential with respect to the tube cathode and having an array of isolated p-type regions on the target surface each of which forms a junction diode in the substrate. An electron scanning beam reverse-biases each successive diode segment to a voltage equal to the difference in potential of the substrate and the cathode. The leakage current of these diodes in the absence of light is sufficiently small that the diodes will remain in this reverse-biased condition for more than one second.

Light impinging on the n-type substrate from the side opposite the electron beam and immediately adjacent to the diodes considerably increases the leakage current by photon production of hole-electron pairs. As the beam again scans the p-type surface, recharging it to cathode potential and, thus establishing the full value of reverse-bias, the charge it deposits on each of the p-type regions equals the charged removed by the leakage current during the preceding frame period. This charge in turn is dependent on the localized light intensity to which that segment of the semi-conductor has been subjected. Recharging of the diode is accompanied by a current through the external circuit. This current, over a frame period, varies in proportion to the spatial distribution of the light intensity at successive positions of the scanning electron beam and constitutes the video output signal.

In the copending application of Messrs. Buck, Crowell and Gordon, Ser. No. 605,715, filed Dec. 29, 1966, and assigned to the assignee hereof, the diodes are proportioned so that the electron beam impinges on several simultaneously to avoid problems from inexact registration of the target structure and from failures of individual diodes. Further, the portion of the semiconductor substrate on the electron beam target surface is shielded from the beam by an insulating coating. To control the potential of the surface, a conductive coating overlies the insulating coating and is connected to a bias source to drain electrons from the insulator. Separate conductive contacts, or islands, which are electrically isolated from the conductive coating are deposited over the diodes to increase the capacitance of the diode junctions. Alternatively, these islands may be made by first evaporating over the whole target a continuous conductive coating; next the islands are separated from the rest of the coating by an appropriate technique, such as etching.

We have recognized that it would be desirable to avoid the tedious processes needed to provide conductive islands separate from the conductive coating. Further, if etching is used, it is potentially harmful to the underlying insulating coating. With any process for providing the separation between the conductive coating and the conductive islands, the underlying insulating coating may be sufficiently exposed to accumulate charge from the electron beam, contrary to the original purpose of the conductive coating.

*Summary of the invention*

According to our invention, these problems are solved by employing, instead of the conductive coating, a semi-insulating layer over the insulating coating to moderate charge buildup on the insulating coating. By semi-insulating layer, we mean a layer of material having a discharge time constant greater than the frame time of the camera tube but substantially less than the discharge time constant of the highly insulating coating. The discharge time constant of a material is a time constant associated with lateral conduction in the material in the presence of the other elements of a combination that contributes some capacitance. We employ a semi-insulating material typically having a resistivity appreciably greater than that of substantially intrinsic silicon. For example, the resistivity typically may be in the range of $3\times10^9$ ohm-centimeters to $3\times10^{10}$ ohm-centimeters. When associated with typical values of capacitance with respect to the semiconductor substrate, the resulting discharge time constant of the semi-insulating layer will be about 0.1 to one second.

A preferred embodiment of the invention employs a layer of deposited silicon monoxide, although another embodiment employing antimony trisulfide has shown substantial promise. Other materials for the semi-insulating layer would be cadmium sulfide, zinc sulfide, arsenic trisulfide, antimony triselenide, arsenic triselenide, nickel oxide, titanium oxide, mixtures of any of the foregoing, and mixtures of high-conductivity and low-conductivity materials to yield a film having the desired resistivity. Even silicon dioxide sufficiently highly doped with gold, as may be achieved by sputtering silicon dioxide and gold upon the more highly insulating surface simultaneously, will have the properties desired for the semi-insulating layer.

Advantageously, the semi-insulating layer does not conduct charge quickly enough between diodes to impair resolution in the scanning of the light images incident upon the opposite side of the semiconductor diode structure, yet it will conduct charge quickly enough so that adjustments of the camera tube, such as dynamic range adjustments, do not cause transients longer than about one second.

Other features of our invention reside in techniques for partially reducing a silicon dioxide insulating coating to a silicon monoxide semi-insulating layer during fabrication of the target structure.

*Brief description of the drawings*

A more complete understanding of our invention may be obtained from the following detailed description, taken together with the accompanying drawing, in which.

*Description of illustrative embodiments*

Figure 1:
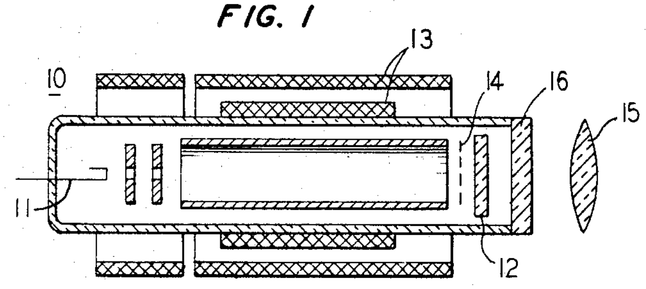
FIG. 1 is a schematic illustration of a television camera tube in accordance with one embodiment of the invention.

FIG. 1 shows a television camera tube 10 comprising a cathode 11 for forming and projecting an electron beam toward a target structure 12. Coils 13 deflect the electron beam in a known manner so that it scans a target surface on the target structure 12 in a line and frame sequence. Secondary electrons from the target surface are collected by a secondary electron collector grid 14. A lens 15 projects incoming light through a transparent face plate 16 and images it on a light admitting surface of the target structure 12. As will become clearer from the discussion below, the purpose of television camera tube 10 is to convert incoming light into stored electrical energy in the form of a charge pattern, to store the charge pattern for a sufficient period of time to permit the electron beam to scan the target surface, and to transmit in the form of a video output signal information representative of the stored image.

Figure 2:
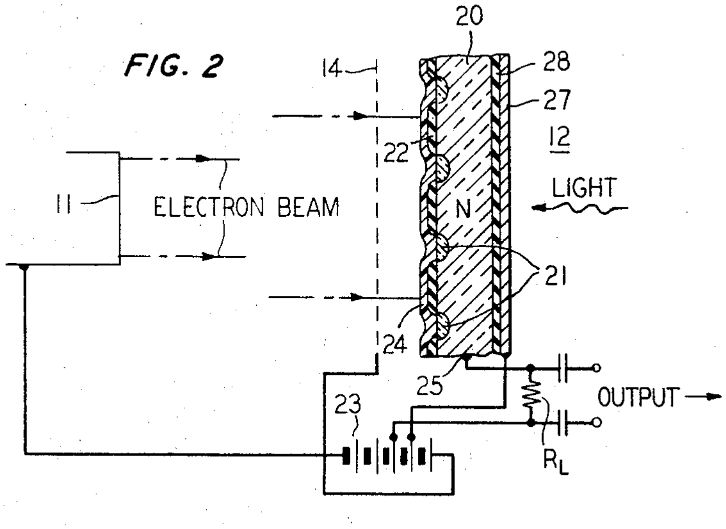
FIG. 2 is an enlarged view of part of the apparatus of FIG. 1.

FIG. 2 shows one embodiment of the invention in which the target structure 12 comprises a semiconductor wafer the major portion of which is an n-type substrate 20 with isolated p-type regions 21 forming a mosaic along the target surface of the semiconductor. Coating 22 of highly insulating material covers the entire target surface side of the n-type substrate and exposes only the separate p-type target regions to the electron beam. Coating 22 has a thickness of 0.01 micron to 0.6 micron and overlaps the edges of the p-type regions to shield the n-region from the beam and to protect the junctions against possible shorting. The substrate 20 is connected through a suitable conducting contact 25 to a load resistance $R_L$ which is in turn connected to a battery 23 that maintains it at a positive potential with respect to the cathode.

A semi-insulating layer 24 of silicon monoxide (SiO) is vacuum-deposited over the insulating coating 22 and the p-regions 21. The deposition is accomplished to a thickness between approximately 0.8 micron to 2.5 microns at a temperature of about 100 degrees centigrade, or in any case less than 300 degrees centigrade. This layer 24 will have a discharge time constant in the structure shown of about one second. The discharge time constant of layer 24 is that time in which 63 percent of the charge previously accumulated in a median region of layer 24 can be conducted to the connection to battery 23. Its resistivity is illustratively $1\times10^{10}$ ohm-centimeters but could vary by about an order of magnitude. Thus, it could lie in the range from $3\times10^{9}$ ohm-centimeters to $3\times10^{10}$ ohm-centimeters. Layer 24 need not be connected to battery 23, since the primary effect of its charge moderating function is to distribute charge from the insulating coating 22 to the closest p-regions 21.

A transparent silicon dioxide insulating layer 28 is deposited on the back, or light-receiving, surface of substrate 20, as described hereinafter, and is covered with an essentially transparent conductor electrode 27, such as a thin layer (200 Angstron units) of evaporated gold. Electrode 27 is connected to battery 23 at a point that is positive with respect to the cathode.

In operation, as the electron beam scans the target surface, it deposits electrons on the p-type regions 21 to reverse-bias each of the individual diodes. The electrons pass rapidly (within $35\mu$ seconds) through the thin dimension of layer 24 to regions 21, even though they can move only much more slowly in the lateral dimension because of the higher effective resistance coupled with the capacitance with respect to substrate 20 across insulating layer 22.

In the absence of any light impingement, this bias voltage would decay slowly due to unavoidable leakage current, sometimes called the "dark" current, across the junction of each diode. However, when the substrate 20 is illuminated, incoming photons produce hole-electron pairs in the substrate some of which diffuse to the diode space charge region adding measurably to the charge flow across the junction and thereby increasing the rate of discharge or reverse-bias voltage decay. It has been found experimentally that insulator 28 and electrode 27 increase the rate of diffusion of these electron-hole pairs.

Similar results have been described heretofore in the above-cited copending application of Buck and others. It is now believed that the insulator 28, when formed in the presence of steam as described hereinafter, tends to eliminate the surface defects that would otherwise provide recombination centers for the newly created electrons and holes. Nevertheless, we do not wish to limit our invention by this explanation.

After some finite period of time, the voltage profile due to the charge distribution of the diode array is a function of the spatial distribution of light intensity to which the diodes have been subjected. When the electron beam again scans the target surface, the electron charge it deposits on each p-type region equals the electron discharge during the preceding frame period. The beam impingement causes a surge of current through the load resistor $R_L$ to the substrate 20 equal to the recharging current of the diode junction, which is indicative of the light intensity to which that junction has been subjected. This current surge creates a voltage across $R_L$ which is taken as the output video signal as shown in the drawing.

The spacing between p-type regions 21 is made smaller than the diameter of the electron beam so that as the electron beam scans the target surface it impinges simultaneously on several p-type regions. The insulator coating 22 prevents current surges through the resistor $R_L$ due to impingement on the n-type substrate, which would generate spurious output signals even in the absence of light. We have found that it is practical to make the p-type regions of about 8 microns in diameter with center-to-center spacings of about 20 microns between the p-type regions in both the length and width dimensions. Then, with a beam effectively at least 1 mil (25 microns) in diameter, several diodes will be impinged simultaneously by the beam.

Electrons which miss the p-regions 21 will be stopped by the insulating coating 22 or repelled by the charge on the coating 22. Those electrons that are collected by the coating 22 will be conducted slowly by the semi-insulating layer 24 toward the nearest p-regions 21. This effect occurs with a time constant of about one second, so that image resolution within each frame period is not appreciably impaired.

A detailed fabrication technique for the embodiment of FIG. 2 will be described hereinafter.

Figure 3:
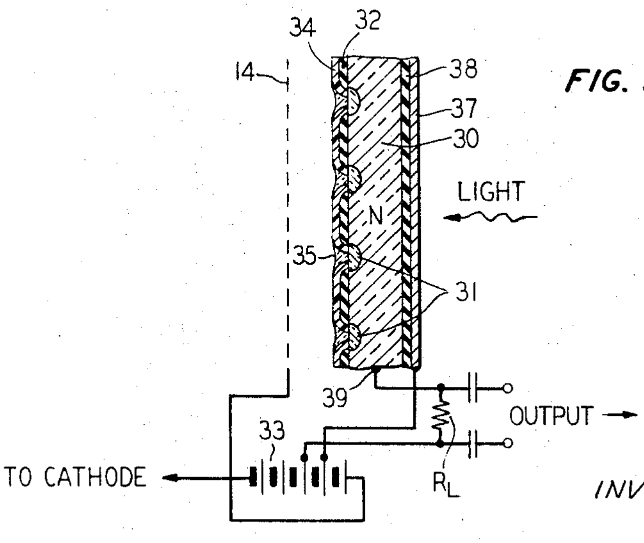
FIG. 3 is an enlarged view of part of a target structure of a television camera tube in accordance with another embodiment of the invention.

The embodiment of FIG. 3 provides a thin, semi-insulating layer 34 of silicon monoxide tightly formed over the surface of the insulating silicon dioxide coating 32, which may have apertures over the separate p-type target regions 31 and thus is shaped like insulating coating 22 of FIG. 2. The semi-insulating layer 34 is provided with parameters like that of layer 24 of FIG. 2 and functions substantially identically. The semi-insulating layer 34 is formed at an interface between the silicon dioxide and an outer layer of silicon in the presence of heat, as described in more detail in connection with FIGS. 4 and 5. The outer layer of silicon is then protected by conventional masking techniques over the central portions of the p-regions 31 and is etched down to the silicon monoxide layer 34 elsewhere. It should be noted that the usual etchants for silicon do not etch silicon monoxide.

The mask is then removed, leaving the conductive silicon islands 35 directly over the p-regions 31 of the diodes. The silicon islands 35, if desired, may be extended outward over the silicon monoxide layer 34 to increase further the effective capacitance of the diode junctions. This result can be achieved simply by etching the overlying silicon layer only in a web of narrow channels at points midway between adjacent diodes.

The semi-insulating layer 34 need not be connected to any bias source. Nevertheless, if desired, layer 34 can be connected to battery 33 at a point more positive than the cathode (not shown), if it (layer 34) does not contact the p-regions 31.

The substrate 30 is connected through a suitable contact 39 to a load resistance $R_L$, which is in turn connected to battery 33 at a point that is positive with respect to the cathode.

A transparent silicon dioxide insulating layer 38 is deposited or grown on the back, or light-receiving, surface of the substrate 30, as described hereinafter, and is covered with a semitransparent conducting electrode 37, such as a thin gold layer. Electrode 37 is connected to battery 33 at a point that may be positive with respect to the cathode.

In operation, electrons from the beam readily pass into the silicon islands 35 and flow to the nearby diode junction between a p-region 31 and substrate 30 to reestablish the full reverse bias of the junctions. Simultaneously, a corresponding charge flows in the output circuit resistance, $R_L$.

In a manner similar to that of the corresponding components in the embodiment of FIG. 2, the insulator 38 and electrode 37 increase the efficiency of utilization of the electron-hole pairs produced by the light passing therethrough to substrate 30.

The detailed fabrication techniques will now be described:

For a device having sensitivity in the visible and near infrared portion of the spectrum, the target structure of FIG. 2 is typically made as follows: n-type silicon, 5 to 15 mils thick, is polished to form the substrate 20, then oxidized to form a layer of silicon dioxide 0.01 micron to 0.6 micron thick in which an array of apertures 8 microns in diameter, 20 microns center-to-center, is etched using conventional photolithographic masking and etching techniques. The layer of silicon dioxide so etched forms the oxide insulating coating 22. Boron is diffused into the exposed areas of the substrate 20 at 1140 degrees centigrade to form the p-type regions 21, with the oxide layer 22 acting as a diffusion mask. Any boron glass or impurity layer that tends to form on the oxide layer is removed with a suitable solvent or etchant. To facilitate making a good ohmic contact 25 to the substrate 20, phosphorus is diffused into the exposed areas of the substrate at 925 degrees centigrade; and any resulting glass or impurity layer is then removed from the oxide layer 22 with a suitable solvent. In the region not previously doped with boron, the phosphorus makes the material highly n+; and a good contact is easily made to such material by a conventional technique employing a vacuum-evaporated metal (gold, for example). The silicon dioxide insulating layer 28 is then formed on the back surface of the substrate 20 in the presence of steam at 950 degrees centigrade or at temperatures as much as several hundred degrees lower. The resulting oxide layer is known as a wet oxide layer and apparently has a beneficial effect in reducing surface recombination of the induced photo electrons and holes at the back surface of substrate 20. The electrode 27, for example, a thin layer of gold or other suitable conductor, is then deposited over wet oxide layer 28 on the back surface by vacuum deposition. Lastly, the semi-insulating layer 24 of silicon monoxide is vacuum-deposited on the front surface of the assembly over the insulating layer 22 and the p-regions 21. It is deposited at a temperature of about 100 degrees centigrade to a thickness of about one micron. This temperature is usually produced by the heat inherent in the evaporation process. It should be understood that the semi-insulating layer 24 deposited in the foregoing process could be, as well as silicon monoxide, zinc sulfide, cadmium sulfide, antimony trisulfide, arsenic trisulfide, antimony triselenide, arsenic triselenide, titanium oxide, nickel oxide, mixtures of the foregoing, or mixtures of highly-conductivity and low-conductivity materials.

The target is then assembled into the camera tube as shown in FIG. 1 and is baked at an elevated temperature to drive out occluded gases.

Figure 4:
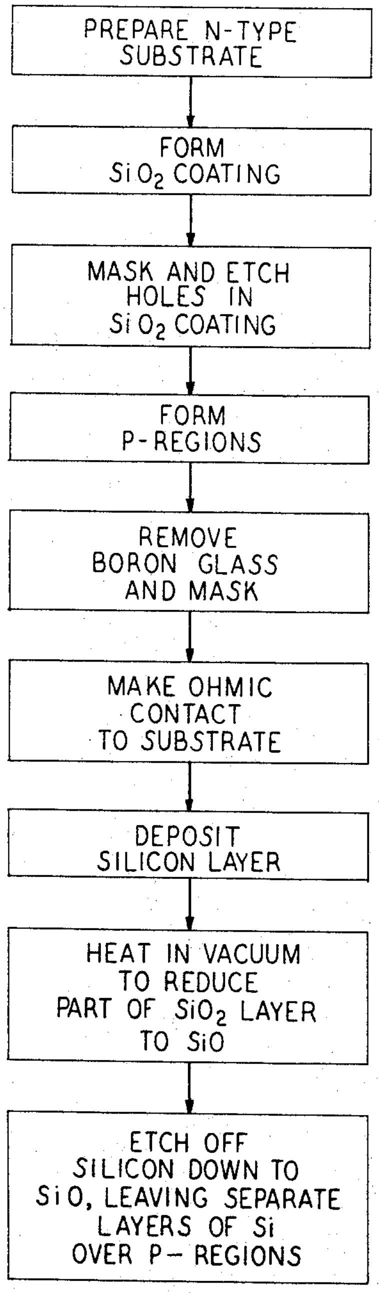
FIG. 4 is a first diagram showing one sequence of steps for making the embodiment of FIG. 3.
Figure 5:
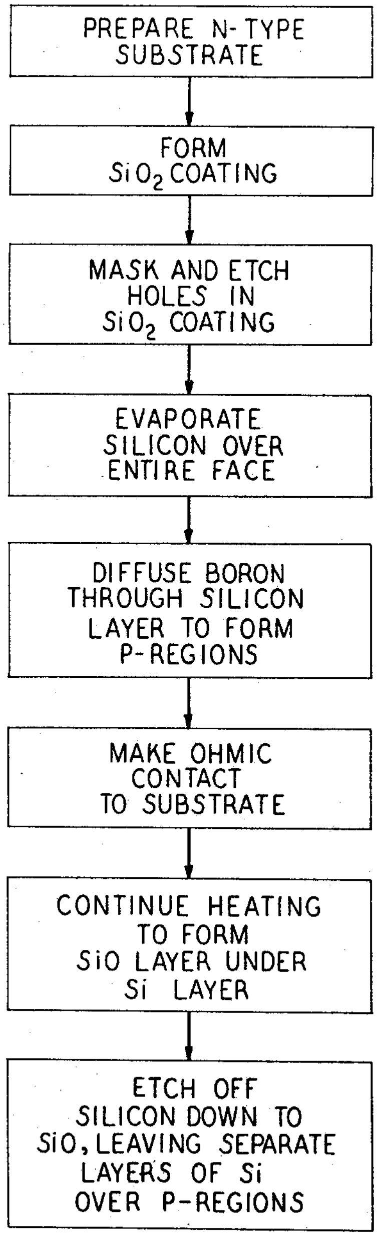
FIG. 5 is a second diagram showing another sequence of steps for making the embodiment of FIG. 3.

The target structure of FIG. 3 may be made either by the process set out in block diagram form in FIG. 4 or by the process set out in block diagram form in FIG. 5.

In carrying out the process of FIG. 4, the substrate 30 is prepared and the silicon dioxide insulating coating 32 with an array of apertures therein is formed in the manner described for the embodiment of FIG. 2. The apertures in coating 32 are 8 microns in diameter and 20 microns center-to-center. The p-regions 31 and the ohmic contact 39 are formed, as before, by steps including a boron diffusion and a subsequent phosphorus diffusion. A layer of silicon is vacuum-deposited at a temperature of about 100 degrees centigrade to a depth of one-half micron over the oxide layer 32 and the p-regions 31. As before, the heat from the evaporation process is sufficient to produce this temperature. Continued heating at an elevated temperature of about 1,000 degrees centigrade for about thirty minutes then reduces a portion of the silicon dioxide insulating layer 32 to form the silicon monoxide semi-insulating layer 34. These values of temperature and time are not critical and may vary within wide limits. The duration of the continued heating is sufficient to insure that the semi-insulating layer 34 directly contacts the p-regions 31. Finally, as much of the overlying silicon is etched away as needed to isolate the silicon islands 35 from one another. The silicon monoxide layer 34 remains intact, since it will not be etched by the etchant for silicon.

Alternatively, the target structure of FIG. 3 may be fabricated by the process set out in FIG. 5, the details of which are as follows: the substrate 30 is prepared and the silicon dioxide insulating layer 32 with an array of apertures therein is formed as described for the embodiment of FIG. 2. Before any diffusion is done, a layer of silicon is vacuum-deposited at a temperature of about 100 degrees centigrade to a depth of about one-half micron over silicon oxide layer 32 and the apertures, as for the process of FIG. 4. Boron is next diffused at 1,140 degrees centigrade through the previously deposited layer of silicon in the apertures into the underlying substrate 30 to form the p-type regions 31 and the associated junctions. Since the oxide layer 32 is now protected by the silicon, no boron glass or impurity layer is formed on the oxide. The phosphorus diffusion may now be done on that portion of the target which is to serve as ohmic contact; and the contact is made to the substrate 30. During these two diffusions, the silicon monoxide insulating layer 34 forms automatically under the overlying silicon layer, but the heating may be continued, if necessary to complete the silicon monoxide layer. Finally, as much of the overlying silicon is etched away as needed to isolate the silicon islands 35 from one another. The silicon monoxide layer 34 remains intact.

The process of FIG. 5 has the advantage over the process of FIG. 4 that the layer of silicon over the silicon dioxide insulating layer 32 prevents the formation of pinholes that otherwise tend to occur either during each diffusion or during the subsequent removal of glass or similar impurity layer. Also, it does not require an additional heat treatment of the completed target as does the process of FIG. 4.

Various modifications of the disclosed embodiments are within its scope. For example, the semi-insulating layer may be evaporated onto the target surface by sputtering silicon in a mixed gas plasma onto the silicon dioxide layer and apertures to form a semi-insulating film. For example, a mixed silicon-silicon nitride film could be deposited by sputtering silicon through a mixed nitrogen, argon plasma. The plasma automatically supplies the proper conditions inasmuch as it is achieved by application of microwave energy in a range determined by the materials. Within this range, the ratio of nitrogen to argon in the plasma may be controlled to control the ratio of silicon to silicon nitride in the film deposited and therefore, the resistivity of the film. Thickness would be in the range from one to three microns, as determined by the duration of the sputtering. Background information concerning processes of this type is set forth in Joseph R. Ligenza's patent, Patent No. 3,287,243, issued Nov. 22, 1966. The resulting film is one example of a mixture of a high-conductivity material (silicon) and a low-conductivity material (silicon nitride) for the semi-insulating layer, as described in the summary of the invention.

What is claimed is:

1. In an electron beam storage device, the combination comprising,

- a target structure comprising a semiconductive wafer the major portion of which is of a first conductivity type;
- the semiconductive wafer including on a first surface thereof an array of regions, each of the regions defining with the major portion of the wafer a p-n junction;
- means for reverse-biasing the p-n junctions comprising means for periodically scanning the target structure with an electron beam;
- means for shielding the portion of the wafer of the first conductivity type from the electron beam comprising a coating of insulating material over that part of the first surface of the wafer that is of the first conductivity type; and
- means for moderating charge buildup on said coating of insulating material, comprising a layer of material extending over said coating and having, in said combination, a discharge time constant greater than the period of said scanning and less than the relaxation time of said coating of insulating material.

2. A combination according to claim 1 in which the layer of material over the coating comprises a layer of material selected from the group consisting of antimony trisulfide, cadmium sulfide, silicon monoxide, nickel oxide, titanium oxide, zinc sulfide, arsenic trisulfide, antimony triselenide, arsenic triselenide, mixtures of the foregoing, and a mixture of silicon and silicon nitride.

3. A combination according to claim 1 in which the layer of material over the coating consists of a layer of silicon monoxide.

4. A combination according to claim 1 in which the layer of material over the coating has a discharge time constant between 0.1 second and one second.

5. A combination according to claim 1 in which the coating of insulating material consists of a layer of silicon dioxide and in which the layer of material over said coating consists of a layer of silicon monoxide.

6. A process for making an electron beam target structure from a silicon semiconductive wafer the major portion of which is of a first conductivity type, comprising the steps of

- forming a silicon dioxide insulating layer on said wafer,
- making an array of apertures in said silicon dioxide insulating layer,
- depositing a layer of silicon over said silicon dioxide insulating layer and said apertures on one surface of said wafer,
- diffusing a doping impurity through said layer of silicon and through said apertures to form regions of a second conductivity type in the vicinity of said apertures,
- heating said wafer to form silicon monoxide between said silicon dioxide layer and said silicon layer, and
- separating regions in said silicon layer, which regions are associated with respective ones of said apertures.

7. A process according to claim 6 in which at least a portion of the heating is accomplished concurrently with the diffusion.

References Cited

UNITED STATES PATENTS

| | | | |
|---|---|---|---|
| 3,213,315 | 10/1965 | Lempert | 315—10 |
| 3,193,418 | 7/1965 | Cooper et al. | 148—187 |
| 3,144,366 | 8/1964 | Rideout et al. | 148—187 X |
| 2,945,973 | 7/1960 | Anderson | 315—10 X |
| 2,843,773 | 7/1958 | Wardley | 315—10 X |

RODNEY D. BENNETT, *Primary Examiner.*

CHARLES L. WHITHAM, *Assistant Examiner.*

U.S. Cl X.R.

148—187; 315—21